United States Patent
Chung et al.

(10) Patent No.: US 9,686,863 B2
(45) Date of Patent: Jun. 20, 2017

(54) STACK STRUCTURE OF HIGH FREQUENCY PRINTED CIRCUIT BOARD

(71) Applicant: KUANG YING COMPUTER EQUIPMENT CO., LTD., New Taipei (TW)

(72) Inventors: Hsuan-Ho Chung, New Taipei (TW); Chien-Ling Tseng, New Taipei (TW)

(73) Assignee: KUANG YING COMPUTER EQUIPMENT CO., LTD., New Taipei (TW)

( * ) Notice: Subject to any disclaimer, the term of this patent is extended or adjusted under 35 U.S.C. 154(b) by 139 days.

(21) Appl. No.: 14/838,355

(22) Filed: Aug. 27, 2015

(65) Prior Publication Data

US 2016/0088723 A1    Mar. 24, 2016

(30) Foreign Application Priority Data

Sep. 19, 2014    (TW) .............................. 103132377 A

(51) Int. Cl.
| | |
|---|---|
| *H05K 1/11* | (2006.01) |
| *H05K 1/14* | (2006.01) |
| *H05K 1/02* | (2006.01) |

(52) U.S. Cl.
CPC ........... *H05K 1/144* (2013.01); *H05K 1/0225* (2013.01); *H05K 1/0245* (2013.01); *H05K 1/117* (2013.01); *H05K 1/0219* (2013.01); *H05K 2201/042* (2013.01); *H05K 2201/09336* (2013.01); *H05K 2201/09718* (2013.01); *H05K 2201/10189* (2013.01); *H05K 2201/10446* (2013.01)

(58) Field of Classification Search
CPC .. H05K 1/0219; H05K 1/0225; H05K 1/0245; H05K 1/117; H05K 1/144; H05K 2201/042; H05K 2201/09336; H05K 2201/09718; H05K 2201/10189; H05K 2201/10446
See application file for complete search history.

(56) References Cited

U.S. PATENT DOCUMENTS

| | | | |
|---|---|---|---|
| 6,353,189 B1 * | 3/2002 | Shimada ............... | H01L 21/563 174/255 |
| 6,777,620 B1 * | 8/2004 | Abe ...................... | H01L 23/552 174/255 |
| 7,110,263 B2 * | 9/2006 | He ......................... | H01P 3/081 361/794 |
| 8,472,202 B1 * | 6/2013 | Clewell ................ | H05K 1/0222 361/748 |
| 2002/0060366 A1 * | 5/2002 | Kikuchi ................. | H01L 23/13 257/776 |

(Continued)

*Primary Examiner* — Yuriy Semenenko
(74) *Attorney, Agent, or Firm* — Leong C. Lei

(57) ABSTRACT

A stack structure of a high frequency printed circuit, mainly includes a transmission conductor pin group in a form of single row, where each signal pair and each transmission pair of the transmission conductor pin group respectively have a through hole portion thereon, and the inner layer of the circuit board has a trace portion in electric connection with the through hole portion, allowing each four terminals to be formed into one group. Utilizing the clever arrangement of the through hole portions and trace portions separates each terminal properly, thereby increasing the property of transmitted signals, and, at the same time, reducing noise interferences such as EMI and RFI.

18 Claims, 7 Drawing Sheets

(56) References Cited

U.S. PATENT DOCUMENTS

2010/0258337 A1* 10/2010 Hsu ..................... H05K 1/0245
                                                          174/254
2011/0253424 A1* 10/2011 Lai ...................... H05K 1/0253
                                                          174/254
2013/0140070 A1*  6/2013 Clewell ................ H05K 1/0222
                                                          174/260

* cited by examiner

STACK STRUCTURE OF HIGH FREQUENCY PRINTED CIRCUIT BOARD

TECHNICAL FIELD OF THE INVENTION

The present invention relates to a stack structure of a high frequency printed circuit board, capable of isolating high frequency signals effectively so as to decrease the electromagnetic interference and radio frequency interference caused from the high frequency signals to circuit boards or other external electronic products.

DESCRIPTION OF THE PRIOR ART

Since interference intensity is inversely proportional to distance, the more delicate electronic products are, the easier they are failure because of interferences. Therefore, how to solve interference problems is an urgent priority.

Signals with a frequency larger than 2.4 GHz are referred to as high frequency signals, the interference of which will decrease the sensitivity of wireless reception, and further reduces reception range, being sufficient enough to influence the normal use of wireless devices; such signals cannot be eliminated through filtering such that external housings are used to isolated noises, or a ground terminal is added beside a signal terminal to decrease high frequency noises. But, a single layer of ground terminal has a weak isolation effect if the circuit board is a multilayer board.

SUMMARY OF THE INVENTION

The main object of the present invention is to provide a stack structure of a printed circuit board, solving the interference problem generated from high frequency signals effectively by collocating a transmission conductor pin group containing high frequency signals with structures such as through hole portions, trace portions and ground layers by means of pairs of signal terminals and pairs of power terminals arranged in a group of four.

To achieve the above object, the present invention mainly includes a transmission conductor pin group in a form of single row, first differential power unit, a second differential power unit configured at one side of the first differential power unit, a first differential detection unit configured at one side of the second differential power unit far away from the first differential power unit, a second differential detection unit configured at one side of the first differential detection unit far away from the second differential power unit, a third differential power unit configured at one side of the second differential detection unit far away from the first differential detection unit, and a fourth differential power unit configured at one side of the third differential power unit far away from the second differential detection unit, wherein each differential power unit includes a pair of differential signals and a pair of power transmissions respectively configured at the two sides of each pair of differential signals, and each differential detection unit includes a pair of differential signals and a pair of detection signals respectively configured at the two sides of each pair of differential signals, whereby, when a user adopts the pin arrangement in a form of single row of four differential power units and two differential detection units for the structure composition of a high frequency printed circuit board and utilizes through hole portions, trace portions and ground layers to isolate high frequency signals, the effectiveness of decreasing electromagnetic and radio frequency interferences can then be achieved.

DETAILED DESCRIPTION OF THE PREFERRED EMBODIMENTS

Figure 1:
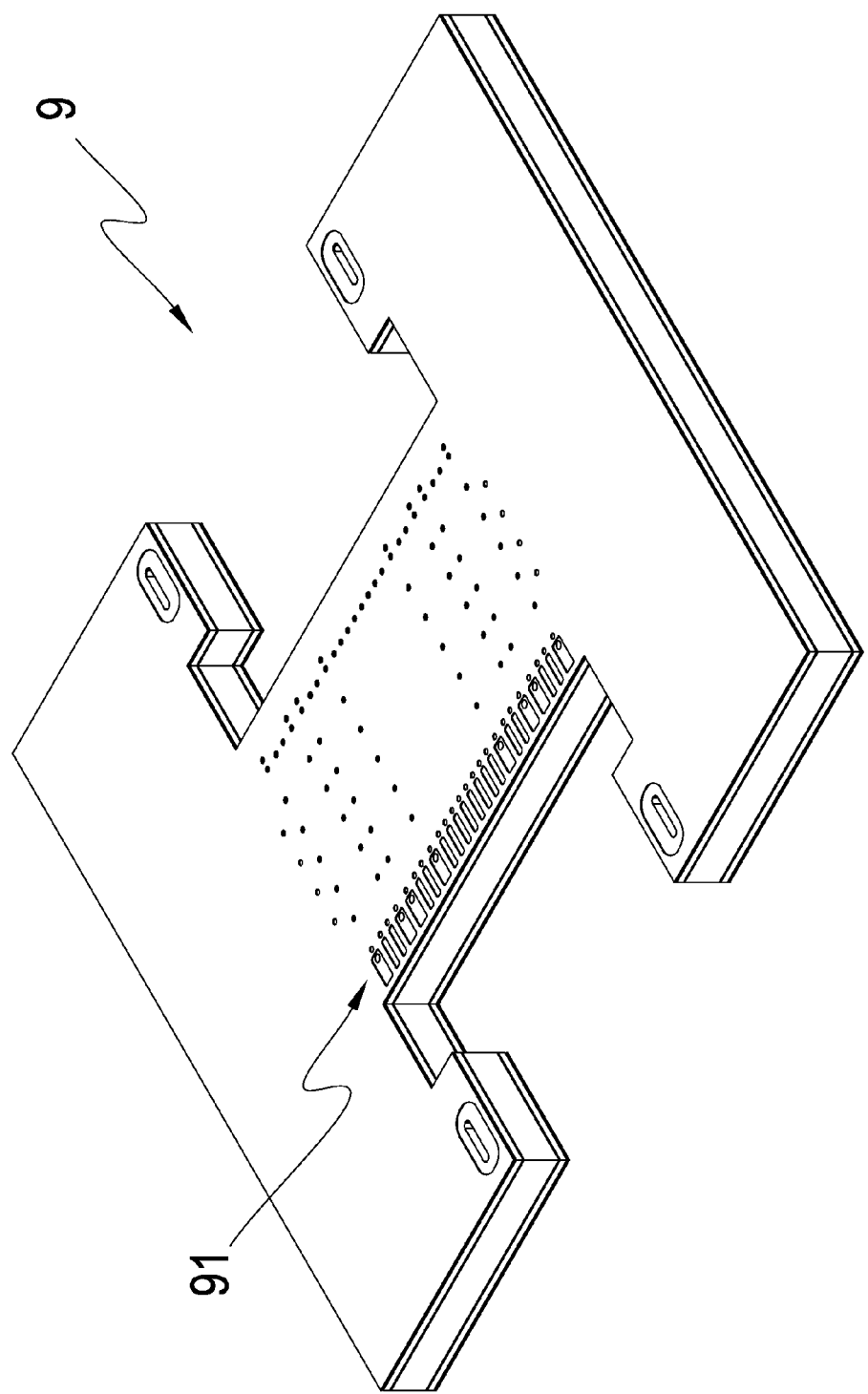
FIG. 1 is a perspective view of a preferred embodiment of the present invention.
Figure 2:
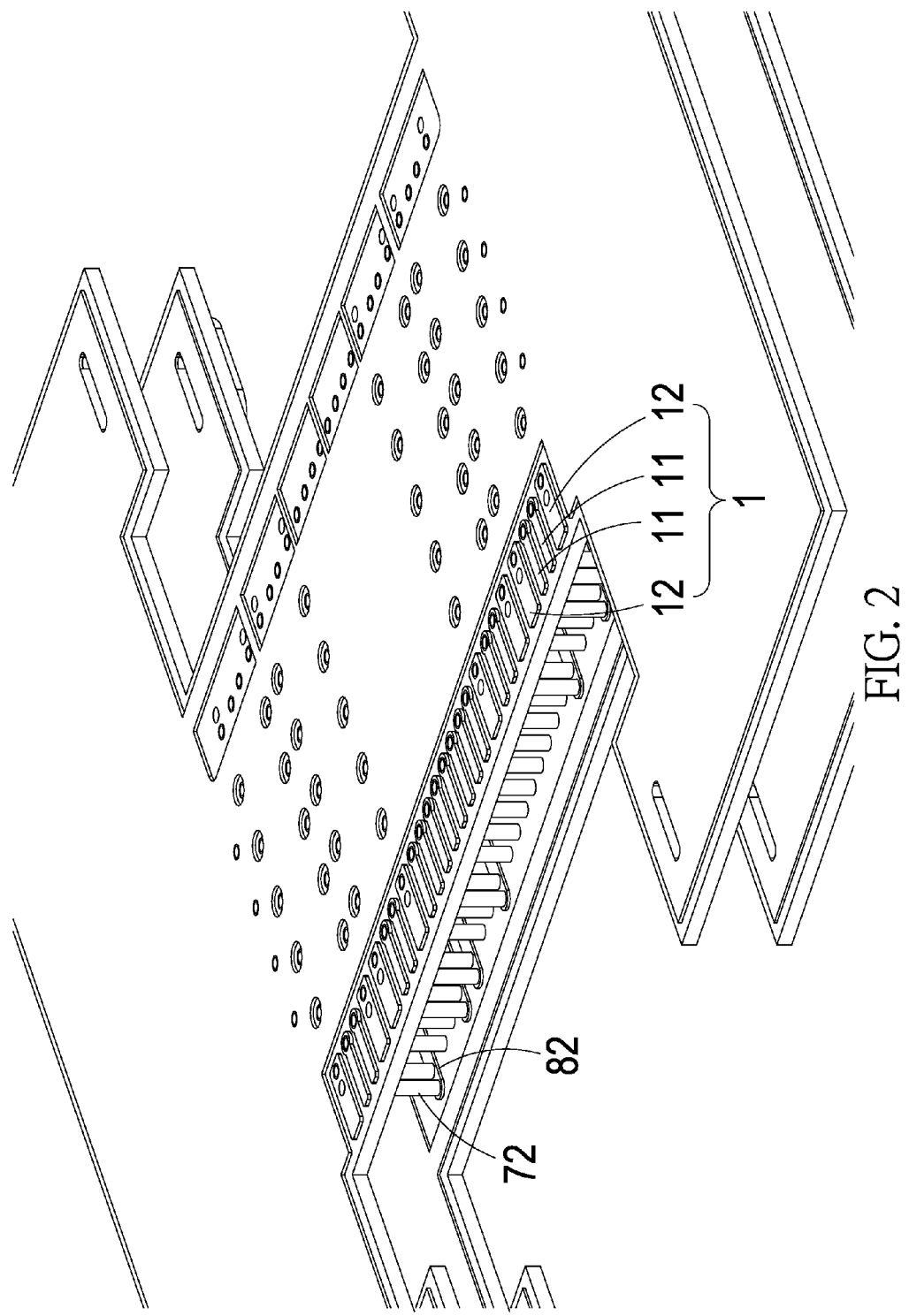
FIG. 2 is a schematic view of a stack structure of the embodiment of the present invention.

Referring to FIGS. 1 to 4, a high frequency printed circuit board 9 includes a single row form of transmission conductor pin group 91, and further mainly includes:

a first differential power unit 1, including a pair of first differential signals 11 and a pair of first power transmissions 12 respectively configured at the two sides of the pair of first differential signals 11;

a second differential power unit 2, configured at one side of the first differential power unit 1, and including a pair of second differential signals 21 and a pair of second power transmissions 22 respectively configured at the two sides of the pair of second differential signals 21;

a first differential detection unit 5, configured at one side of the second differential power unit 2 far away from the first differential power unit 1, and including a pair of fifth differential signals 51 and a pair of fifth detection signals 52 respectively configured at the two sides of the pair of fifth differential signals 51;

a second differential detection unit 6, configured at one side of the first differential detection unit 5 far away from the second differential power unit 2, and including a pair of sixth differential signals 61 and a pair of second detection signals 62 respectively configured at the two sides of the pair of differential signals 61.

A third differential power unit 3, configured at one side of the second differential detection unit 6 far away from the first differential detection unit 5, including a pair of third differential signals 31 and a pair of third power transmissions 32 respectively configured at the two sides of the pair of third differential signals 31;

A fourth differential power unit 4 is configured at one side of the third differential power unit 3 far away from the second differential detection unit 6, and including a pair of fourth differential signals 41 and a pair of fourth power transmissions 42 respectively configured at the two sides of the pair of fourth differential signals 41.

As described above, the pair of first differential signals 11, the pair of second differential signals 21, the pair of third differential signals 31, the pair of fourth differential signals 41, the pair of fifth differential signals 51 and the pair of sixth differential signals 61 respectively have at least one differential through hole portion 71 thereon, and the pair of first power transmissions 12, the pair of second power transmissions 22, the pair of third power transmissions 32 and the pair of fourth power transmissions 42 respectively have at least two power through hole portions 72. Furthermore, the pair of first detection signals 52 and the pair of second detection signals 62 respectively have at least one detection through hole portion 73 thereon.

The differential through hole portion 71 is in electric connection with a differential trace portion 81 positioned on the inner layer of the high frequency printed circuit board 9, the power through hole portion 72 a power trace portion 82 positioned on the inner layer of the high frequency printed circuit board 9, and the detection through hole portion 73 a detection trace portion 83 positioned on the inner layer of the high frequency printed circuit board 9.

Figure 3:
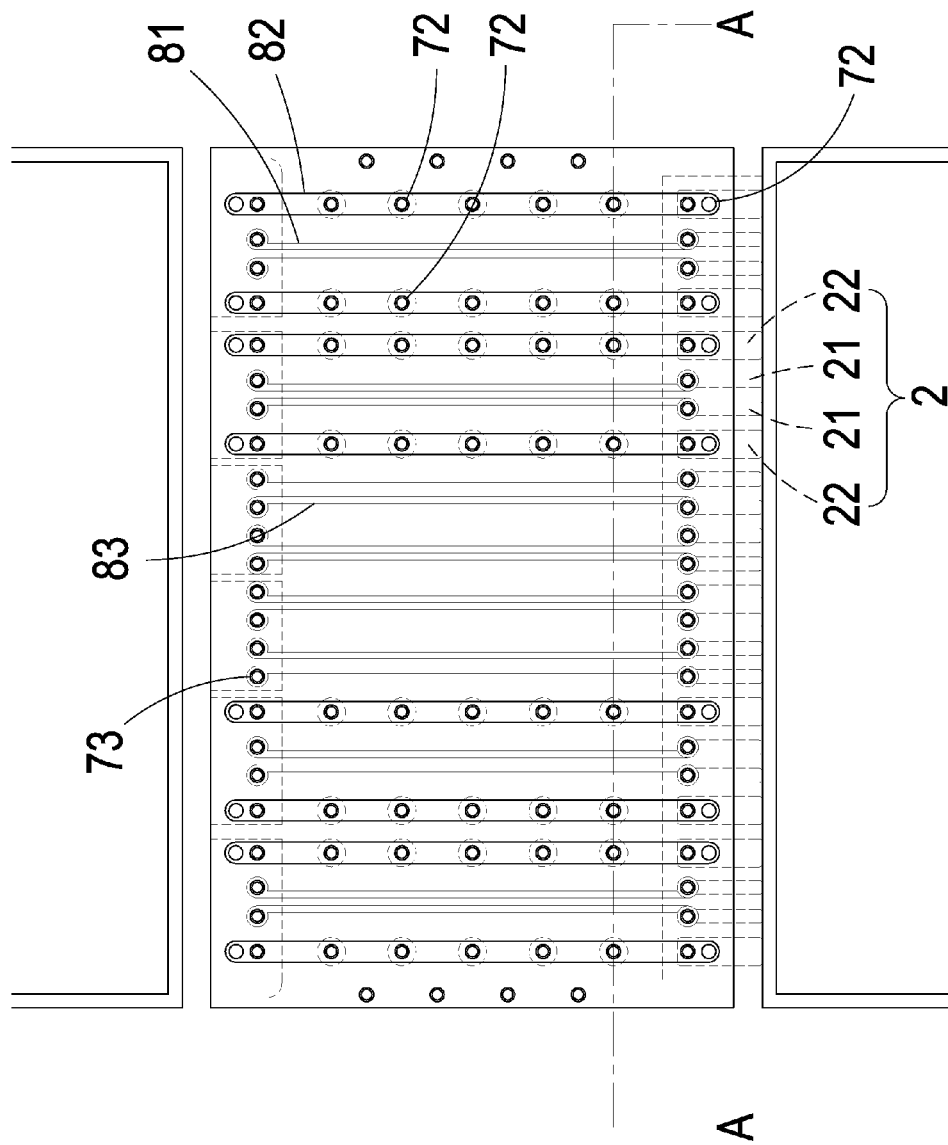
FIG. 3 is a schematic view of the embodiment of the present invention.
Figure 4:
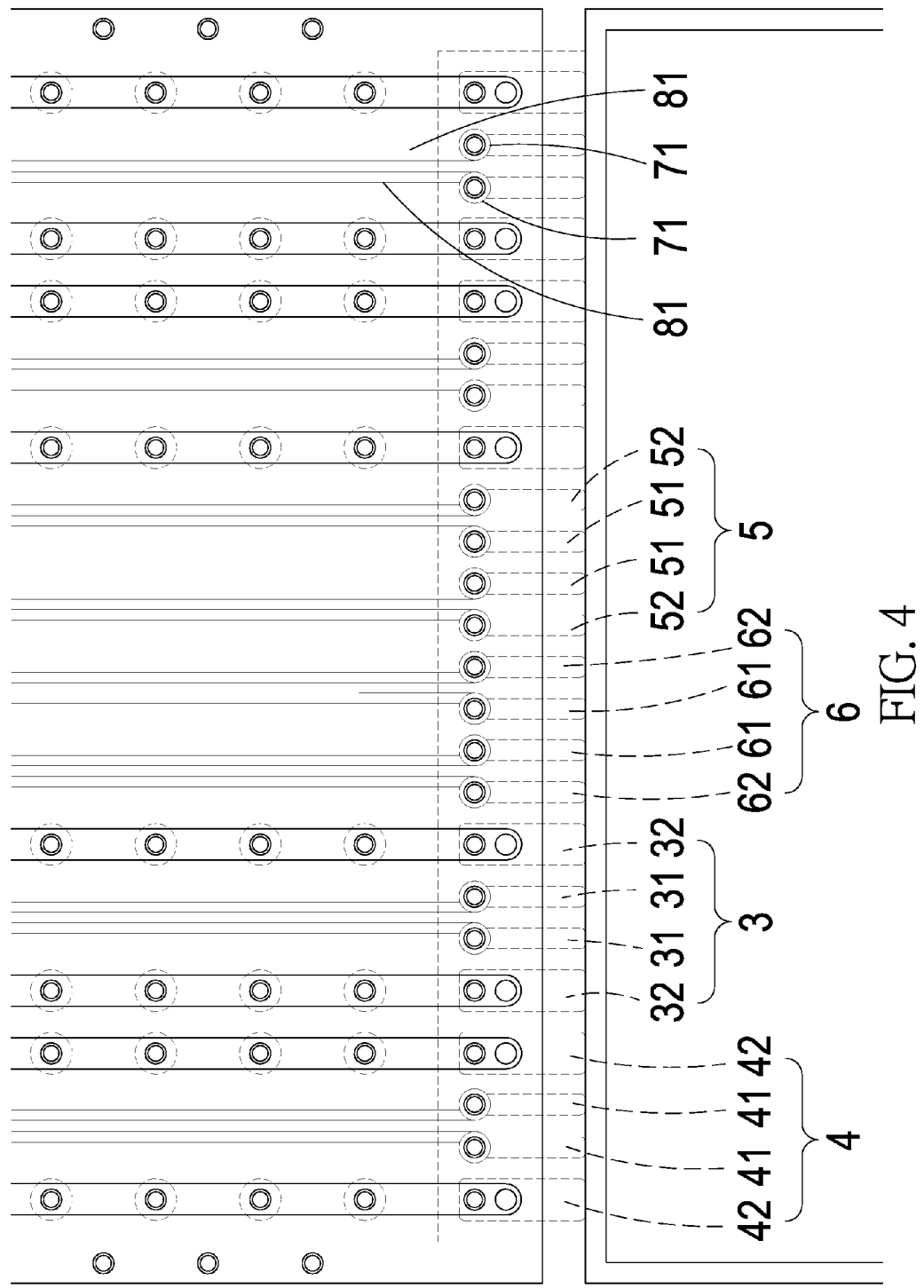
FIG. 4 is a partly enlarged view of FIG. 3.
Figure 5:
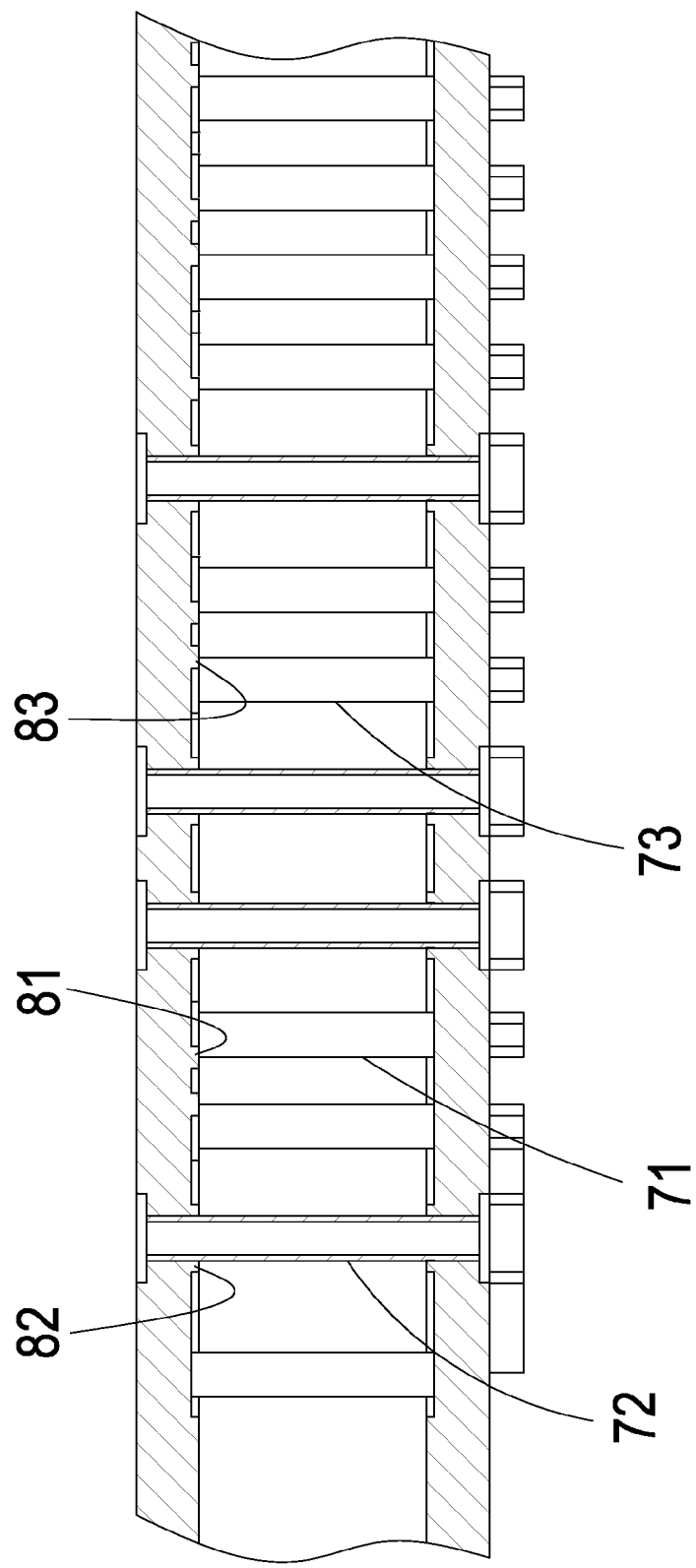
FIG. 5 is a cross-sectional view taken along line A-A of FIG. 3.

The appearance of the high frequency printed circuit board 9, as FIGS. 1 to 5 show, is not different obviously from general circuit boards, but the internal stack structure thereof is mainly formed with the transmission conductor pin group 91 in a single row by arranging the first, second, third, fourth differential power units (1, 2, 3, 4) and the first, second differential detection units (5, 6) side by side, and the power through hole portions 72, as FIG. 3 shows, are positioned on the power trace portions 82 symmetrically and equidistantly. Furthermore, the number and positions of the surface layers at the two sides of the power through hole portions 72 correspond to each other and the power trace portion 82 is parallel to the differential trace portion 81, thereby blocking the noises caused from the pairs of first, second, third, fourth differential signals (11, 21, 31, 41) therebetween. In particular, it can be seen from FIG. 4 that the spacing of the inner edge of the differential through hole portion 71 is the same as the one of the inner edge of the differential trace portion 81, the width of the differential trace portion 81 is smaller than the diameter of the differential through hole portion 71, and the spacing between the outer edge of the differential trace portion 81 and the inner edge of the power trace portion 82 is larger than the spacing of the inner edge of the differential trace portion 81, thereby controlling a trace distribution condition to decrease the interference to each other. Finally, referring to FIG. 5, the differential trace portion 81, power trace portion 82 and detection trace portion 83 are respectively positioned on the upper and lower layers inside the high frequency printed circuit board 9, and respectively in communication with each other through the differential through hole portion 71, power through hole portion 72 and detection through hole portion 73, thereby reducing the noise interference such as EMI or RFI of high frequency signals.

Figure 6:
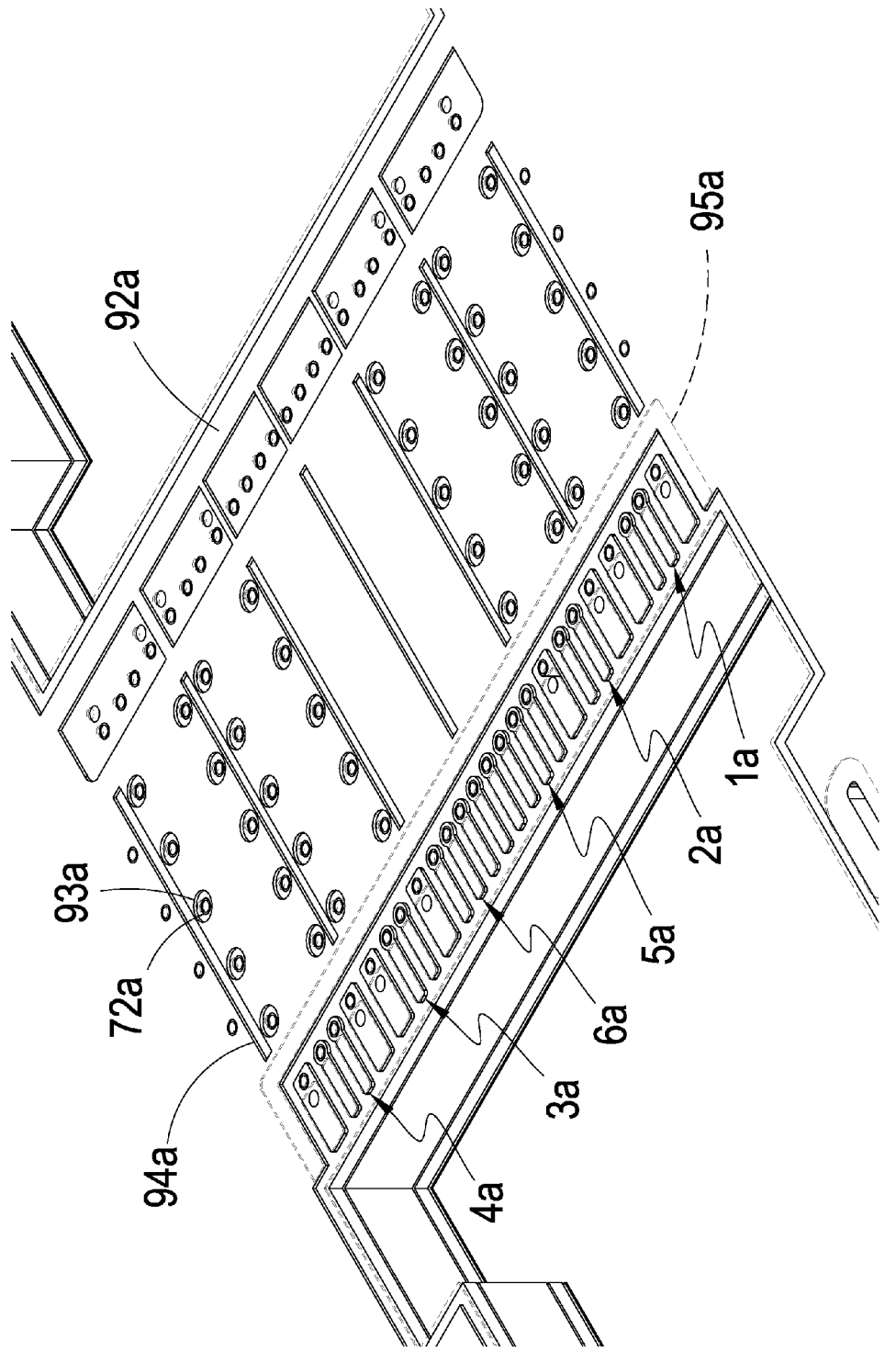
FIG. 6 is a schematically perspective view of another preferred embodiment of the structure according to the present invention.
Figure 7:
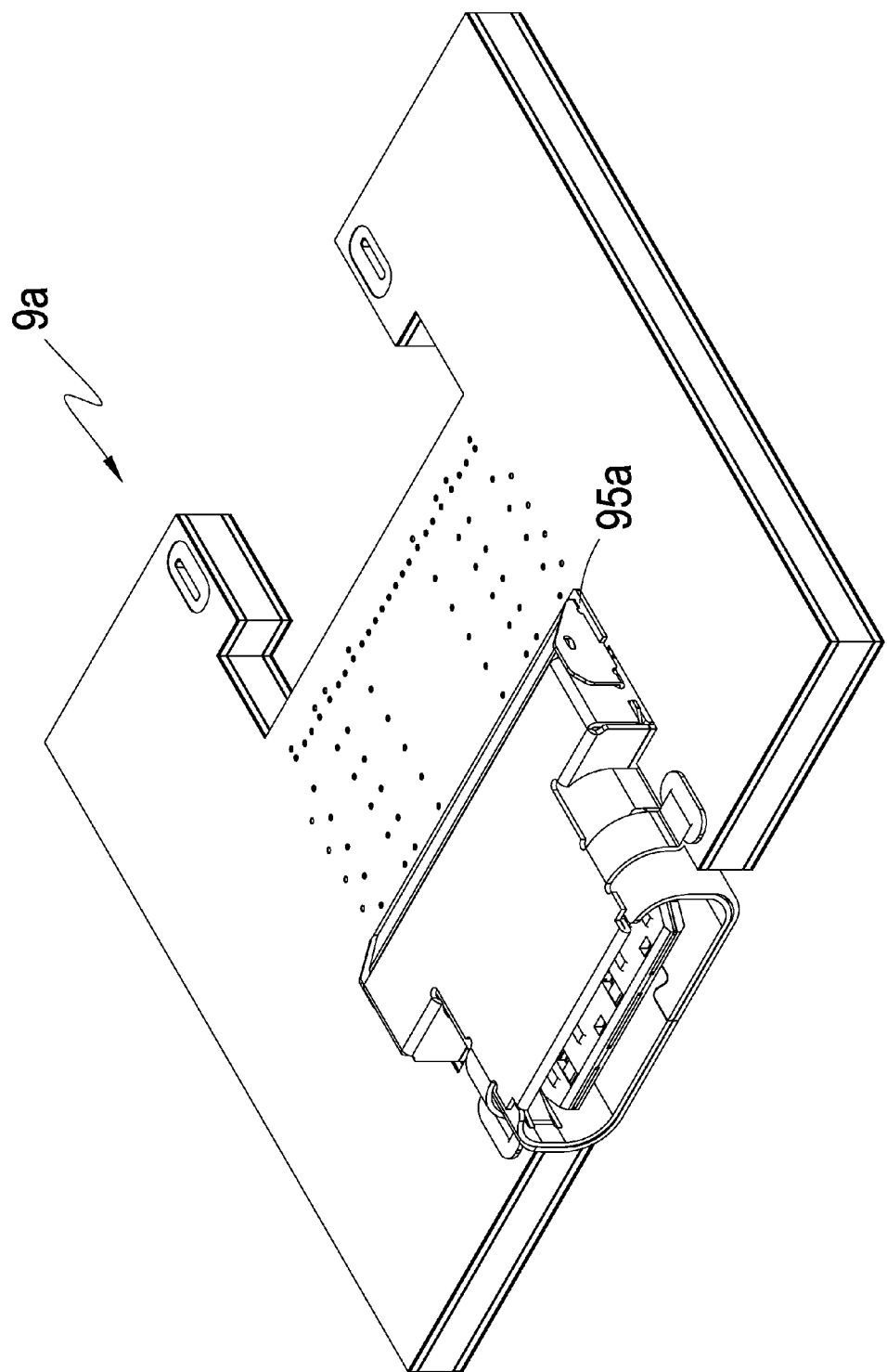
FIG. 7 shows the structure of the FIG. 6 in a use state.

Referring to FIGS. 6 and 7, the two surface layers of the high frequency printed circuit board 9a respectively have a ground layer 92a, and a ring groove portion 93a for separating the ground layer 92a from the power through hole portion 72a is configured between the ground layer 92a and the surface layer of the power through hole portion 72a. Furthermore, the ground layer 92a has a groove portion 94a respectively at the two sides of the first differential power unit 1a, second differential power unit 2a, third differential power unit 3a and fourth differential power unit 4a. Finally, an isolation portion 95a is adapted to cover the first differential power unit 1a, second differential power unit 2a, third differential power unit 3a, fourth differential power unit 4a, first differential detection unit 5a and second differential detection unit 6a. Whereby, the ground layers 92a on the surface layers of the two sides of the high frequency printed circuit board 9a are used to sandwich high frequency signals within the high frequency printed circuit board 9a, and groove portion 94 is further used to separate the first to fourth differential power units (1a, 2a, 3a, 4a) and first, second differential detection units (5a, 6a) one by one with the feature of the power through hole portions 72a being distributed equidistantly. In addition, the surface layer of each power through hole portion 72a having a ring groove portion 93a plus each power transmission pair and the ground layer 92a being not conductive to each other can avoid a short circuit happening between the ground layer 92a and power through hole portion 72a, thereby increasing the effectiveness of noise suppression substantially. In particular, the isolation portion 95a not only allows a connector housing to be soldered thereon but isolates the transmission conductor pin group from the outside, thereby reducing the signal interference between the high frequency printed circuit board 9a and a connector connected thereto.

The present invention utilizes the way of arranging the four terminals of each differential power unit and each differential detection unit as a group in a row and the clever configurations of each through hole portion and each trace portion, with the layer-by-layer isolation of the ground layer 92a, ring groove portion 93a, groove portion 94a and isolation portion 95a, enabling the high frequency printed circuit board to suppress a high frequency noise such as EMI or RFI properly.

We claim:

1. A stack structure of a high frequency printed circuit board, said high frequency printed circuit board comprising a transmission conductor pin group in a form of single row, and said high frequency printed circuit board also comprising:
    a first differential power unit, comprising a pair of first differential signals and a pair of first power transmissions configured at two sides of said pair of first differential signals;
    a second differential power unit, configured at one side of said first differential power unit, and comprising a pair of second differential signals and a pair of second power transmissions configured at two sides of said pair of second differential signals;
    a first differential detection unit, configured at one side of said second differential power unit far away from said first differential power unit, and comprising a pair of fifth differential signals and a pair of first detection signals respectively configured at two sides of said pair of fifth differential signals;
    a second differential detection unit, configured at one side of said first differential detection unit far away from said second differential power unit, and comprising a pair of sixth differential signals and a pair of second detection signals respectively configured at two sides of said pair of sixth differential signals;
    a third differential power unit, configured at one side of said second differential detection unit far away from said first differential detection unit, and comprising a pair of third differential signals and a pair of third power transmissions respectively configured at two sides of said pair of third differential signals; and
    a fourth differential power unit, configured at one side of said third differential power unit far away from said second differential detection unit, and comprising a pair of fourth differential signals and a pair of fourth power transmissions respectively configured at two sides of said pair of fourth differential signals.

2. The structure according to claim 1, wherein said pair of first differential signals, pair of second differential signals, pair of third differential signals, pair of fourth differential signals, pair of fifth differential signals and pair of sixth differential signals respectively have at least one differential through hole portion thereon.

3. The structure of claim 2, wherein said pair of first power transmissions, pair of second power transmissions, pair of third power transmissions and pair of fourth power transmissions respectively have at least two power through hole portions thereon.

4. The structure according to claim 3, wherein said pair of first detection signals and pair of second detection signals respectively have at least one detection through hole portion thereon.

5. The structure according to claim 4, wherein said differential through hole portion is in electric connection with a differential trace portion positioned on an inner layer of said high frequency printed circuit board, and said power through hole portion is in electric connection with a power trace portion positioned on said inner layer of said high frequency printed circuit board, with said detection through hole portion being in electric connection with a detection trace portion positioned on said inner layer of said high frequency printed circuit board.

6. The structure according to claim 5, wherein a spacing of an inner edge of said differential through hole portion is the same as a spacing of an inner edge of said differential trace portion, and a width of said differential trace portion is smaller than a diameter of said differential through hole portion.

7. The structure according to claim 5, wherein said power through hole portions are positioned on said power trace portion symmetrically and equidistantly, and said power trace portion is parallel to said differential trace portion.

8. The structure according to claim 5, wherein spacing between an outer edge of said differential trace portion and an inner edge of said power trace portion is larger than a spacing of an inner edge of said differential trace portion.

9. The structure according to claim 5, wherein said differential trace portion, power trace portion and detection trace portion are respectively positioned on upper, lower layers of said high frequency printed circuit board, and respectively in communication with each other through said differential through hole portion, power through hole portion and detection through hole portion.

10. The structure according to claim 9, wherein the number and positions of surface layers of two sides of said power through hole portion correspond to each other.

11. The structure according to claim 7, wherein surface layer of two sides of said high frequency printed circuit board respectively have a ground layer.

12. The structure according to claim 11, wherein a ring groove portion is configured between said ground layer and a surface layer of each said power through hole portion, said ring groove portions and adapted to separated said ground layer from said power through hole portions.

13. The structure according to claim 11, wherein said ground layer respectively have groove portion respectively at the two sides of said first, second, third and fourth power units.

14. The structure according to claim 12, wherein said ground layer respectively have groove portion respectively at the two sides of said first, second, third and fourth power units.

15. The structure according to claim 11, wherein said first, second, third and fourth power transmission pairs are not conductive to said ground layer.

16. The structure according to claim 12, wherein said first, second, third and fourth power transmission pairs are not conductive to said ground layer.

17. The structure according to claim 1, further comprising an isolation portion covering said first\, second, third and fourth differential power units, and said first and second differential detection units.

18. The structure according to claim 17, wherein said isolation portion allows a connector housing to be soldered thereon.

* * * * *